(12) United States Patent
Sun et al.

(10) Patent No.: US 12,715,762 B2
(45) Date of Patent: Aug. 25, 2026

(54) MICRO-ELECTRO-MECHANICAL SYSTEMS AND PREPARATION METHOD THEREOF

(71) Applicant: HUAWEI TECHNOLOGIES CO., LTD., Shenzhen (CN)

(72) Inventors: Fengpei Sun, Shenzhen (CN); Zhihong Feng, Shenzhen (CN); Jinghui Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1048 days.

(21) Appl. No.: 17/854,668

(22) Filed: Jun. 30, 2022

(65) Prior Publication Data

US 2022/0324699 A1 Oct. 13, 2022

Related U.S. Application Data

(63) Continuation of application No. PCT/CN2020/138746, filed on Dec. 23, 2020.

(30) Foreign Application Priority Data

Dec. 31, 2019 (CN) ......................... 201911408207.1

(51) Int. Cl.

| | |
|---|---|
| ***B81B 3/00*** | (2006.01) |
| ***B81C 1/00*** | (2006.01) |
| ***G02B 26/08*** | (2006.01) |

(52) U.S. Cl.

CPC ........ *B81B 3/0086* (2013.01); *B81C 1/00166* (2013.01); *G02B 26/0841* (2013.01); *B81B 2201/042* (2013.01); *B81B 2203/0109* (2013.01); *B81B 2203/0136* (2013.01); *B81B 2203/04* (2013.01); *B81B 2203/058* (2013.01);

(Continued)

(58) Field of Classification Search

None

See application file for complete search history.

(56) References Cited

U.S. PATENT DOCUMENTS 5,959,760 A * 9/1999 Yamada ............... G02B 7/1821 359/223.1

6,643,053 B2 11/2003 Li et al.

(Continued)

FOREIGN PATENT DOCUMENTS

CN 101907769 A 12/2010

CN 102298207 A 12/2011

(Continued)

*Primary Examiner* — Jyotsna V Dabbi

(57) ABSTRACT

Micro-electro-mechanical systems and a preparation method thereof are provided. The micro-electro-mechanical systems include first fixed comb fingers, second fixed comb fingers, a support beam, a movable platform, and movable comb fingers. The first fixed comb fingers and the second fixed comb fingers are fastened to a substrate, and the first fixed comb fingers are electrically isolated from the second fixed comb fingers. Two ends of the support beam are fastened to the substrate, and the movable platform is coupled to the support beam. The movable comb fingers are coupled to the movable platform, and form a three-layer comb finger structure with the first fixed comb fingers and the second fixed comb fingers. This structure improves drive efficiency of the micro-electro-mechanical systems.

17 Claims, 8 Drawing Sheets

(52) U.S. Cl.
CPC . *B81B 2207/012* (2013.01); *B81C 2201/0109* (2013.01); *B81C 2201/0132* (2013.01); *B81C 2201/0159* (2013.01); *B81C 2201/019* (2013.01)

(56) References Cited

U.S. PATENT DOCUMENTS

| | | | | |
|---|---|---|---|---|
| 7,095,546 | B2 | 8/2006 | Mala et al. | |
| 7,535,620 | B2 | 5/2009 | Zhou | |
| 8,691,099 | B2 | 4/2014 | Gritters et al. | |
| 8,729,770 | B1 | 5/2014 | Milanovic | |
| 10,876,838 | B2 * | 12/2020 | Shi | G01C 19/5747 |
| 2002/0005976 | A1 * | 1/2002 | Behin | B81C 1/0015<br>359/254 |
| 2003/0156315 | A1 | 8/2003 | Li et al. | |
| 2006/0268383 | A1 | 11/2006 | Cho et al. | |
| 2015/0234176 | A1 | 8/2015 | Zhou | |
| 2019/0074232 | A1 * | 3/2019 | Mao | G01R 31/2829 |

FOREIGN PATENT DOCUMENTS

| | | | |
|---|---|---|---|
| CN | 105353506 | A | 2/2016 |
| CN | 107667067 | A | 2/2018 |
| CN | 110568611 | A | 12/2019 |
| CN | 111204701 | A | 5/2020 |
| CN | 210639349 | U | 5/2020 |
| DE | 102005063640 | B3 | 11/2019 |

* cited by examiner

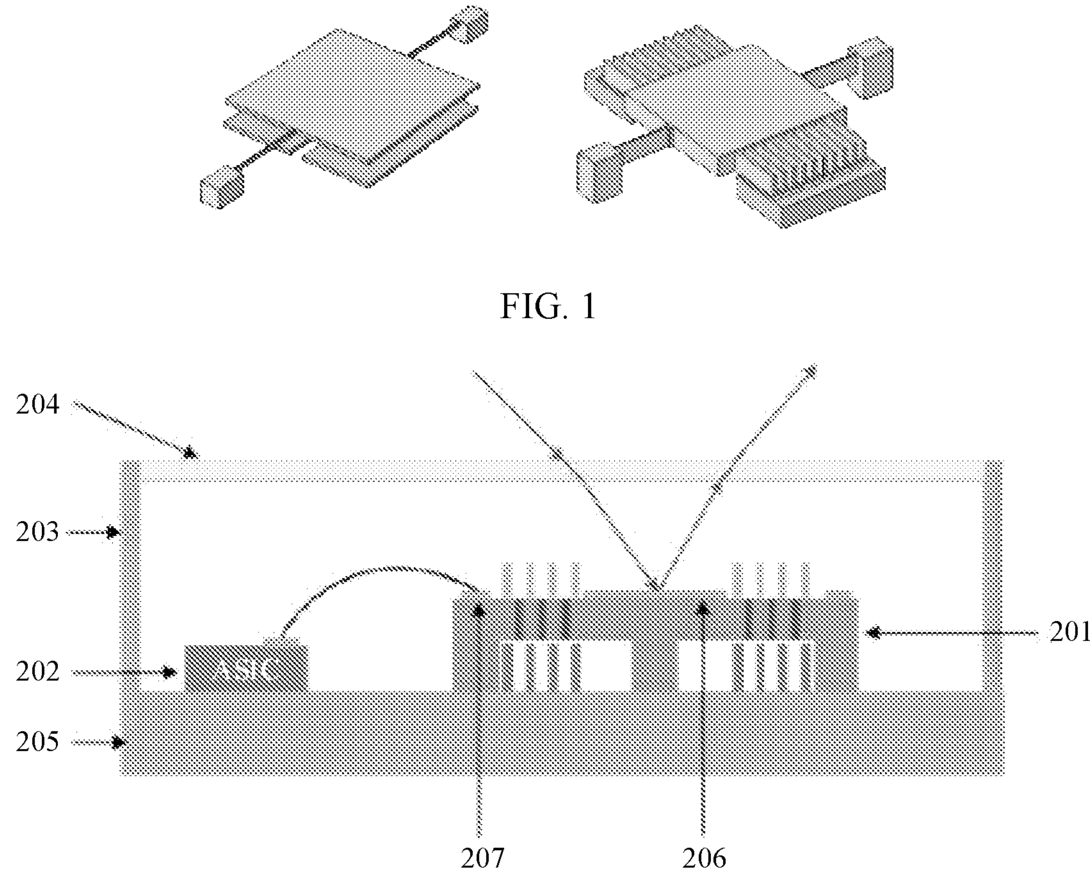
FIG. 1
FIG. 2a
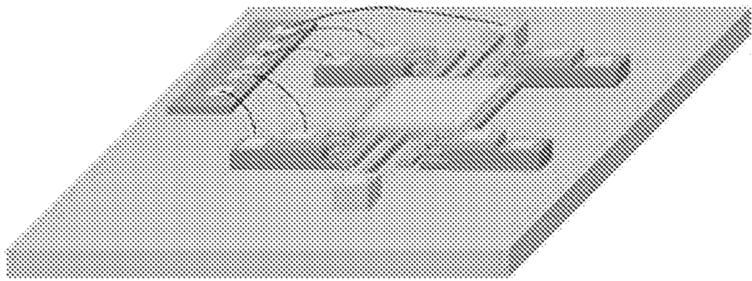
FIG. 2b

MICRO-ELECTRO-MECHANICAL SYSTEMS AND PREPARATION METHOD THEREOF

CROSS-REFERENCE TO RELATED APPLICATIONS

This application is a continuation of International Application No. PCT/CN2020/138746, filed on Dec. 23, 2020, which claims priority to Chinese Patent Application No. 201911408207.1, filed on Dec. 31, 2019. The disclosures of the aforementioned applications are hereby incorporated by reference in their entireties.

TECHNICAL FIELD

The present disclosure relates to the micro-electro-mechanical systems (MEMS) field, and in particular, to an MEMS apparatus and a preparation method thereof.

BACKGROUND

A micro-electro-mechanical systems MEMS device is widely applied to the optical communications field, the consumer electronics field, and the like. A principle thereof is that an electrostatic force and electrostatic torque are generated by using an electric potential difference loaded on a drive structure of the MEMS device, to drive a movable component in the MEMS device to rotate or translate. The drive structure of the MEMS device includes a plate structure, a comb finger structure, and the like.

As shown on a left side of FIG. 1, a movable platform of an MEMS device of the plate structure is coupled to fastening anchors by using a support beam between two sides, and two fixed electrodes are located under the movable platform to form a plate capacitor with the movable platform. The movable platform is an upper electrode of the plate capacitor, and the fixed electrodes are lower electrodes. The movable platform is grounded by using the support beam and the anchors, and a constant or periodically-changed electrostatic bias voltage is applied to the fixed electrode. An electric potential difference between the upper and lower electrodes generates an electrostatic force and electrostatic torque, to drive the movable platform to rotate around the support beam. As shown on a right side of FIG. 1, two sides of a movable platform of an MEMS device of the comb finger structure are coupled to movable comb fingers, respectively corresponding to two groups of lower fixed comb fingers. The movable comb fingers are grounded, and a constant or periodically-changed electrostatic bias voltage is applied to the fixed comb fingers. An electric potential difference between the movable comb fingers and the fixed comb fingers generates electrostatic torque, to drive the movable platform to rotate around a support beam.

SUMMARY

Embodiments of the present disclosure provide a micro-electro-mechanical systems MEMS apparatus and a preparation method thereof, to improve drive efficiency of the MEMS apparatus, improve reliability, and expand an application scope of the MEMS apparatus.

According to a first aspect, an embodiment of the present disclosure provides a micro-electro-mechanical systems MEMS apparatus, including first fixed comb fingers, second fixed comb fingers, a support beam, a movable platform, and movable comb fingers. The first fixed comb fingers and the second fixed comb fingers are fastened to a substrate, and the first fixed comb fingers are electrically isolated from the second fixed comb fingers. Two ends of the support beam are fastened to the substrate, and the movable platform is coupled to the support beam. The movable comb fingers are coupled to the movable platform, and form a three-layer comb finger structure with the first fixed comb fingers and the second fixed comb fingers. The three-layer comb finger structure improves drive efficiency of the MEMS apparatus, and reduces a drive voltage required at specific torque.

In a possible design, the MEMS apparatus includes two three-layer comb finger structures, respectively located on a left side and a right side of the support beam. Therefore, a drive capability is further improved.

In another possible design, the first fixed comb fingers are configured to apply a first electric potential difference between the first fixed comb fingers and the movable comb fingers, and the second fixed comb fingers are configured to apply a second electric potential difference between the second fixed comb fingers and the movable comb fingers. Therefore, a drive capability is further improved.

In another possible design, a metal reflection layer or a dielectric reflection layer is plated on the movable platform. Therefore, the MEMS apparatus can be more widely applied to in the optical communications system field, the consumer electronics field, and the like.

In another possible design, a shape of the movable platform is a rectangle, a polygon, a circle, or an oval. An application scope of the MEMS apparatus is expanded due to different platform shapes.

In another possible design, the first fixed comb fingers are configured to apply an electric potential difference between the first fixed comb fingers and the movable comb fingers, and the second fixed comb fingers are configured to measure a rotation angle of the movable platform by using a capacitance between the second fixed comb fingers and the movable comb fingers. Therefore, an application scope of the MEMS apparatus is further expanded.

In another possible design, the support beam is electrically isolated from the substrate. Therefore, net charge accumulation of the MEMS apparatus is avoided, and long-term stability of the MEMS apparatus is improved.

In another possible design, the first fixed comb fingers are electrically isolated from the second fixed comb fingers by using a first insulation layer, the support beam is electrically isolated from the substrate by using a second insulation layer, and the first insulation layer and the second insulation layer are located on a same plane. This helps reduce a volume of the MEMS apparatus, and reduce preparation costs.

In another possible design, the movable comb fingers are coupled to a side that is of the movable platform and that is perpendicular to the support beam, and the three-layer structure abuts against the support beam. This structure helps reduce a size of the MEMS apparatus, and facilitates application to a micromirror array.

In another possible design, the MEMS apparatus includes two three-layer comb finger structures, located on a same side of the support beam, and the two three-layer comb finger structures are separately configured to control the movable platform. This helps improve drive flexibility of the movable platform.

In another possible design, one of the two three-layer comb finger structures is configured to apply an electric potential difference to drive the movable platform, and the other three-layer comb finger structure is configured to measure a rotation angle of the movable platform. This helps improve use flexibility the MEMS apparatus.

In another possible design, a two-dimensional MEMS apparatus is provided, including two MEMS apparatuses: a first MEMS apparatus and a second MEMS apparatus. A movable platform of the first MEMS apparatus is used as a substrate for fastening the second MEMS apparatus. A support beam of the first MEMS apparatus and a support beam of the second MEMS apparatus are perpendicular to each other. Therefore, two-dimensional rotation of the movable platform is implemented, and an application scope of the MEMS apparatus is further expanded.

In another possible design, an MEMS apparatus array is provided, including a plurality of MEMS apparatuses described above. The plurality of MEMS apparatuses are one-dimensionally distributed or two-dimensionally distributed.

In another possible design, the MEMS apparatus further includes the substrate, a tube housing, a light window, and a control circuit. The substrate is configured to: fasten the first fixed comb fingers and the second fixed comb fingers, and fasten the two ends of the support beam. The tube housing is installed on the substrate, and is configured to protect the MEMS apparatus. The light window is installed on the top of the tube housing, and is configured for light incidence and emergence. The control circuit is configured to control rotation of the movable platform. This complete product helps ensure long-time use of the MEMS apparatus.

According to a second aspect, an embodiment of the present disclosure provides a preparation method of an MEMS apparatus, including: forming first fixed comb fingers on a first wafer through photoetching; forming movable comb fingers, a movable platform, and a support beam on a double-layer second wafer through photoetching; bonding the first wafer to the double-layer second wafer; forming second fixed comb fingers on a bonded wafer through photoetching; and releasing the movable platform and the movable comb fingers. In this method, the foregoing MEMS apparatus of the three-layer comb finger structure is implemented by using one single-layer wafer and one double-layer wafer.

According to a third aspect, an embodiment of the present disclosure provides another preparation method of an MEMS apparatus, including: forming first fixed comb fingers on a first wafer through photoetching; bonding a second wafer to the first wafer; forming, through photoetching, movable comb fingers, a movable platform, and a support beam on a wafer obtained after the two wafers are bonded; bonding a third wafer to the wafer obtained after the two wafers are bonded; forming, through photoetching, second fixed comb fingers on a wafer obtained after the three wafers are bonded; and releasing the movable platform and the movable comb fingers. In this method, the foregoing MEMS apparatus of the three-layer comb finger structure is implemented by using three single-layer wafers.

According to a fourth aspect, an embodiment of the present disclosure provides a use method of an MEMS apparatus, including: applying an electric potential difference between first fixed comb fingers and movable comb fingers of the MEMS apparatus to rotate a movable platform; and measuring a capacitance between second fixed comb fingers and the movable comb fingers of the MEMS apparatus to monitor a rotation angle of the movable platform. In this way, after a change in performance of the MEMS apparatus is monitored, measures may be further taken to compensate for the change in the performance, so that the MEMS apparatus is also applicable to a scenario in which a working environment greatly changes and a scenario in which working is continuous without stopping, thereby expanding a use scope of the MEMS apparatus.

In the foregoing technical solutions provided in the embodiments of the present disclosure, drive efficiency of the MEMS apparatus is improved, a drive voltage is reduced, a problem of net charge accumulation of the MEMS apparatus is alleviated, and long-term stability of the MEMS apparatus is improved. In addition, because the drive efficiency is improved, an occupation area of a drive structure in the MEMS apparatus accordingly decreases, thereby improving an effective duty cycle of the MEMS apparatus, and expanding an application scope of the MEMS apparatus.

BRIEF DESCRIPTION OF DRAWINGS

FIG. 1 is a schematic diagram of MEMS apparatuses of a plate structure and a comb finger structure in the conventional technology;

FIG. 2*a* is a schematic diagram of a cross section of an MEMS apparatus according to an embodiment of the present disclosure;

FIG. 2*b* is a schematic diagram of an MEMS apparatus at 45° according to an embodiment of the present disclosure;

DESCRIPTION OF EMBODIMENTS

Figure 3A:
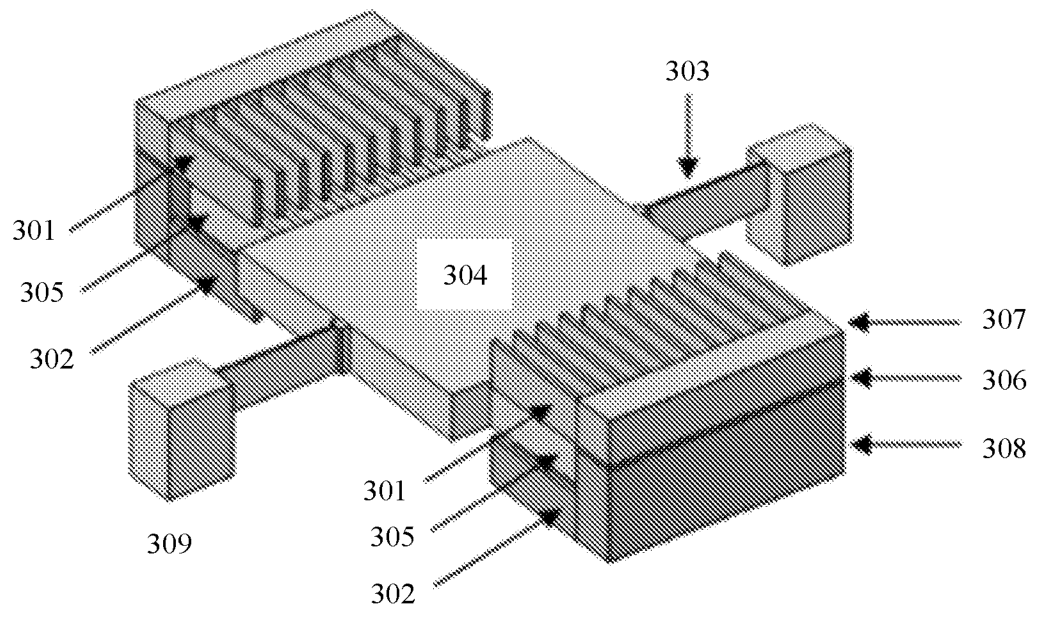
FIG. 3*a* is a schematic diagram of another MEMS apparatus at 45° according to an embodiment of the present disclosure.

To make objectives, technical solutions, and advantages of the present disclosure clearer, the following further describes implementations of the present disclosure in detail with reference to accompanying drawings.

Electrostatic torque generated by a current drive structure is relatively limited. Technology development, device miniaturization, and the like all require an MEMS apparatus to be able to generate larger drive torque, reduce a bias voltage, and reduce an MEMS chip area.

An MEMS apparatus provided in the embodiments of the present disclosure may be an MEMS chip and may be used as an MEMS micromirror or micromirror array. The MEMS apparatus is widely applied to the optical communications field. For example, the MEMS apparatus generates a plurality of output optical signals through cross-reflection of a plurality of input optical signals, to implement optical cross-connect. The MEMS apparatus is further widely applied to the consumer field. For example, the MEMS device adjusts an optical path to implement human eye movement tracking in the augmented reality (AR) field.

FIG. 2*a* and FIG. 2*b* show an MEMS apparatus according to an embodiment of the present disclosure. FIG. 2*a* is a diagram of a cross section of the MEMS apparatus. FIG. 2*b* is a schematic diagram of the MEMS apparatus at 45°. A light window and a sidewall are removed in FIG. 2*b*.

An MEMS chip 201 and a control ASIC Application-Specific Integrated Circuit (ASIC) 202 are packaged in a tube housing 203, and the top of the tube housing is a transparent light window 204, so that light is allowed to be incident and emergent. The MEMS apparatus is fastened to a substrate 205, and the substrate may be a ceramic substrate. A reflection layer 206 is plated on a movable platform of the MEMS apparatus, and is configured to reflect light incident from the light window. The control ASIC is connected to an electrode 207 of comb fingers of the MEMS apparatus by using a lead, and is configured to control the movable platform, for example, control rotation or translation of the movable platform by loading an electrostatic bias onto a three-layer comb finger structure.

Figure 3B:
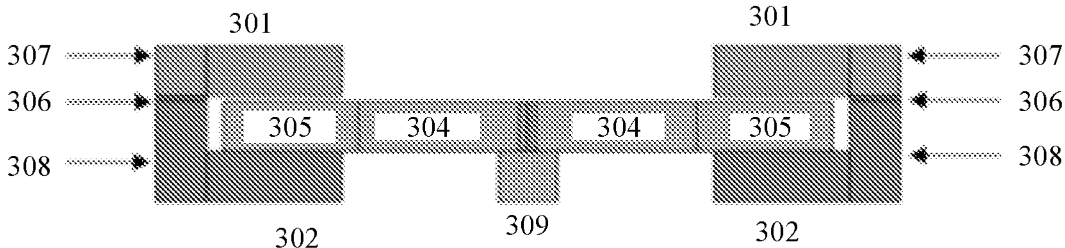
FIG. 3*b* is a schematic diagram of a cross section of another MEMS apparatus according to an embodiment of the present disclosure.

FIG. 3*a* and FIG. 3*b* are schematic diagrams of an MEMS apparatus of a three-layer comb finger structure according to an embodiment of the present disclosure, and show a specific embodiment of the foregoing MEMS chip 201. FIG. 3*a* is a schematic diagram of the MEMS apparatus at 45°. FIG. 3*b* is a diagram of a cross section of the MEMS apparatus. The MEMS apparatus includes upper-layer fixed comb fingers 301, lower-layer fixed comb fingers 302, a support beam 303, a movable platform 304, and movable comb fingers 305. The movable comb fingers form one three-layer comb finger structure with the upper-layer fixed comb fingers and the lower-layer fixed comb fingers. The MEMS apparatus may include one or more three-layer comb finger structures. The MEMS apparatus in FIG. 3*a* and FIG. 3*b* includes two three-layer comb finger structures, located on left and right sides of the support beam.

Lower-layer fixed comb fingers and upper-layer fixed comb fingers on each of the left and right sides are fastened to a substrate, and the substrate is not drawn in FIG. 3*a* and FIG. 3*b*. There is an insulation layer 306 between the upper-layer and lower-layer fixed comb fingers, to implement electrical isolation, so that voltages on the upper-layer and lower-layer fixed comb fingers can be separately controlled to form an electric potential difference with the movable comb fingers. The upper-layer and lower-layer fixed comb fingers are connected to respective electrodes, including an electrode 307 of the upper-layer fixed comb fingers and an electrode 308 of the lower-layer fixed comb fingers. A material of the insulation layer may be silicon dioxide SiO2, silicon nitride SixNy, or the like.

Two ends of the support beam are also fastened to the substrate, and fastening parts on two sides may be referred to as anchors 309. The movable platform is coupled to the support beam. The movable comb fingers on the left and right sides are coupled to the movable platform, and form two three-layer comb finger structures on the left and right sides with the upper-layer fixed comb fingers and the lower-layer fixed comb fingers. An upper part and a lower part of the movable comb fingers respectively correspond to the upper-layer fixed comb fingers and the lower-layer fixed comb fingers, and the movable comb fingers are separately staggered from the upper-layer and lower-layer fixed comb fingers in a horizontal direction, to avoid collision with the fixed comb fingers during rotation around the support beam. The movable comb fingers can be grounded by using the movable platform, the support beam, and the anchors.

The substrate may be a plate, or may be a hollow frame or another fastener that can fasten the upper-layer and lower-layer fixed comb fingers and the two ends of the support beam.

The movable platform, the support beam, the upper-layer fixed comb fingers, the lower-layer fixed comb fingers, and the movable comb fingers all may be made of doped monocrystalline silicon or polycrystalline silicon. A metal reflection layer (such as aluminum or gold) or a dielectric reflection layer may be plated on the movable platform.

The movable comb fingers are coupled to the support beam between the two sides by using the movable platform, and the movable comb fingers can rotate around the support beam. When the movable platform needs to be driven to rotate, electrostatic bias voltages may be respectively applied to left-side upper-layer fixed comb fingers and right-side lower-layer fixed comb fingers. Because the movable comb fingers are grounded, an electric potential difference between the left-side upper-layer fixed comb fingers and movable comb fingers generates electrostatic torque M1, and an electric potential difference between the right-side lower-layer fixed comb fingers and movable comb fingers generates electrostatic torque M2. M1 and M2 are in a same direction, so that torque for driving the movable platform to clockwise rotate around the support beam is M1+M2. Likewise, if electrostatic bias voltages are respectively applied to right-side upper-layer fixed comb fingers and left-side lower-layer fixed comb fingers, the movable platform can be driven to counterclockwise rotate around the support beam.

The drive torque is increased due to the three-layer comb finger structure, thereby improving drive efficiency of the MEMS apparatus. Because the drive efficiency is improved, an occupation area of a drive structure in the MEMS apparatus accordingly decreases, thereby improving an effective duty cycle of the MEMS apparatus. In addition, a drive voltage is also reduced due to the three-layer comb finger structure, thereby alleviating a problem of net charge accumulation of the MEMS apparatus, and improving long-term stability of the MEMS apparatus. An application scope of the MEMS apparatus is expanded due to these effects.

Figure 3C:
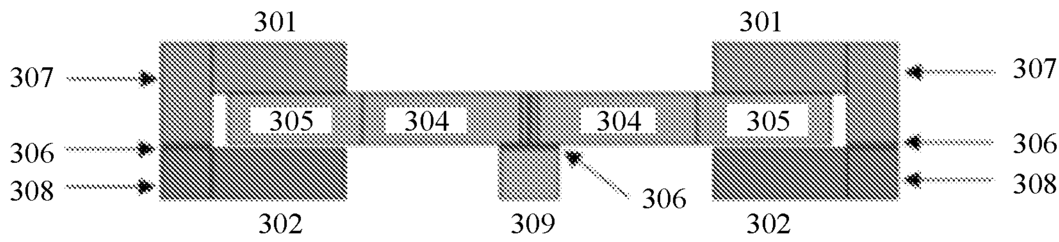
FIG. 3*c* is a schematic diagram of a cross section of still another MEMS apparatus according to an embodiment of the present disclosure.

An insulation layer may also be disposed between the anchor and the support beam. During electrostatic driving, the movable comb fingers and the movable platform can be ungrounded, and an electrostatic bias is separately applied, to flexibly control an electric potential difference between the movable comb fingers and the upper-layer or lower-layer fixed comb fingers. Therefore, drive control flexibility is improved. Further, the insulation layer between the anchor and the support beam may be located on a same plane as the insulation layer between the upper-layer and lower-layer fixed comb fingers, as shown in FIG. 3*c*. The insulation layers are located on the same plane, thereby facilitating preparation of the MEMS apparatus. For details, refer to steps 13 in the following preparation method embodiments shown in FIG. 12 and FIG. 13.

Figure 4A:
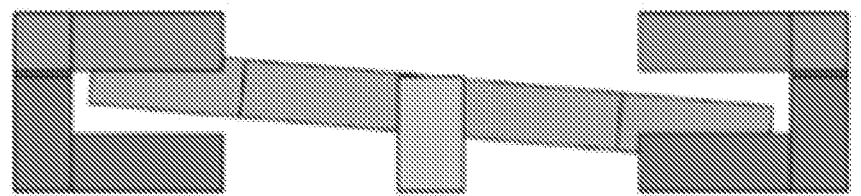
FIG. 4*a* is a schematic diagram of a rotated state of an MEMS apparatus according to an embodiment of the present disclosure.
Figure 4B:
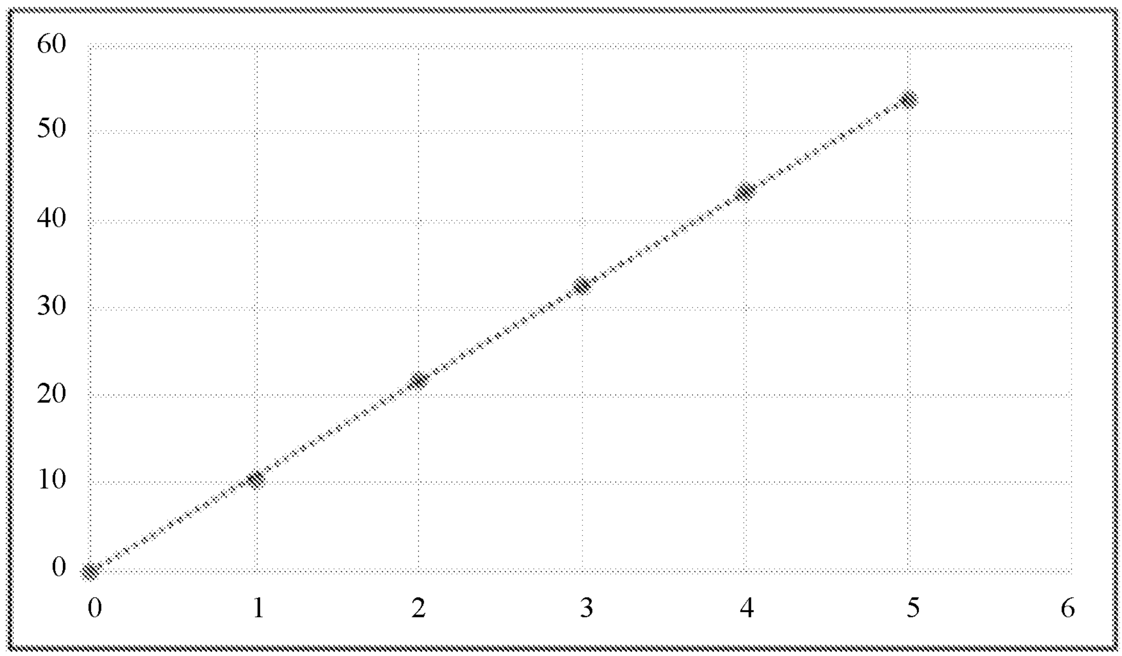
FIG. 4*b* is a schematic simulation diagram of a relationship between a capacitance of a feedback structure and a rotation angle of a movable platform according to an embodiment of the present disclosure.

In addition to being configured to drive the movable platform to rotate, the MEMS apparatus may be further configured to monitor a rotation angle of the movable platform. For example, FIG. 4*a* is a schematic diagram in which a movable platform of an MEMS apparatus rotates when being driven by a drive structure. Right-side upper-layer fixed comb fingers and movable comb fingers form a drive structure, and right-side lower-layer fixed comb fingers and the movable comb fingers form a feedback structure. When a bias voltage is applied to the right-side upper-layer fixed comb fingers, torque generated by an electric potential difference with the movable comb fingers may drive the movable platform to rotate. In addition, a rotation angle A of the movable platform may be monitored by measuring a capacitance C of the feedback structure. FIG. 4*b* is a schematic simulation diagram of a relationship between the capacitance C of the feedback structure and the rotation angle A of the movable platform. A horizontal coordinate represents a rotation angle in a unit of degree (°), and a vertical coordinate represents a capacitance change in a unit of femtofarad (fF).

Likewise, alternatively, the right-side lower-layer fixed comb fingers and the movable comb fingers may form a drive structure, and the upper-layer fixed comb fingers and the movable comb fingers may form a feedback structure. When the movable platform is driven to rotate, a rotation angle of the movable platform is monitored by measuring a capacitance of the feedback structure.

Usually, performance of the MEMS apparatus changes with change of an environmental factor such as a temperature, or with increase of working time. For example, a rotation angle of the movable platform may be different due to a same electric potential difference at different temperatures or during different working duration. After a change in the performance of the MEMS apparatus is monitored, measures may be taken to compensate for the change in the performance, for example, a drive electric potential difference is further adjusted, so that the MEMS apparatus is also applicable to a scenario in which a working environment greatly changes and a scenario in which working is continuous without stopping, thereby expanding a use scenario and a use scope of the MEMS apparatus.

Figure 5A:
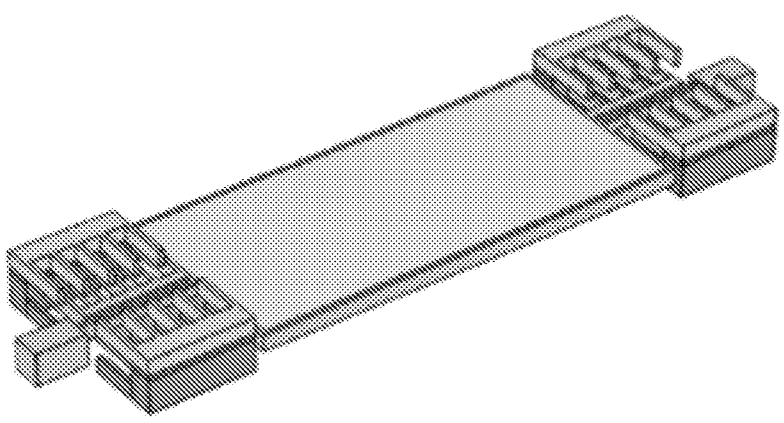
FIG. 5*a* is a schematic diagram of still another MEMS apparatus at 45° according to an embodiment of the present disclosure.
Figure 5B:
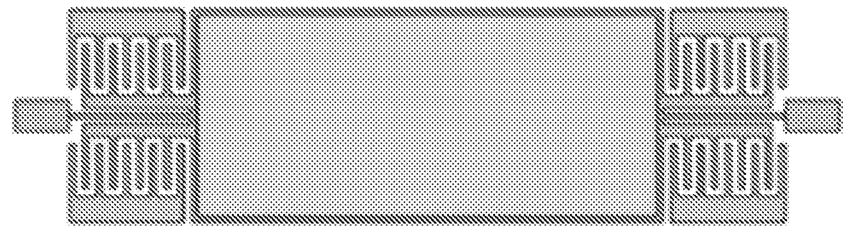
FIG. 5*b* is a schematic diagram of a cross section of still another MEMS apparatus according to an embodiment of the present disclosure.

FIG. 5*a* and FIG. 5*b* disclose a structure of another MEMS apparatus. FIG. 5*a* is a schematic diagram of the MEMS apparatus at 45°. FIG. 5*b* is a diagram of a cross section of the MEMS apparatus. A movable platform is coupled to fastening anchors by using a support beam, and can rotate around the support beam. Three-layer comb finger structures included in the MEMS apparatus are located on two sides of the support beam, and are close to sides that are of the movable platform and that are perpendicular to the support beam, and movable comb fingers are coupled to the sides that are of the movable platform and that are perpendicular to the support beam. This structure helps reduce a size of the MEMS apparatus. A relatively small spacing may be implemented when a plurality of MEMS apparatuses form an array.

Figure 6:
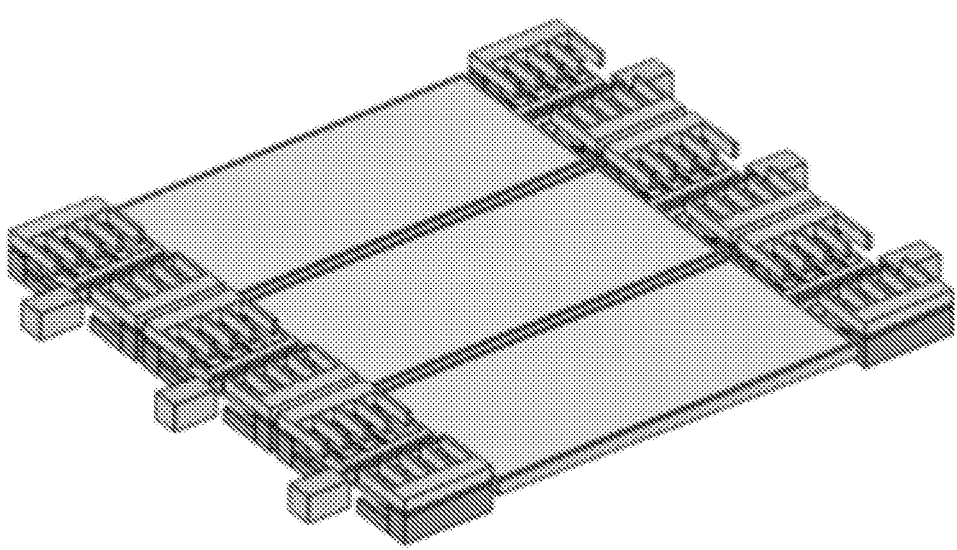
FIG. 6 is a schematic diagram of a one-dimensionally arranged MEMS apparatus array according to an embodiment of the present disclosure.

FIG. 6 is a one-dimensionally arranged MEMS apparatus array. Alternatively, the array may be two-dimensionally arranged, for example, an M*N array, arranged in M rows, where each row has N (M and N are integers) MEMS apparatuses. The MEMS apparatus array can accurately control reflection directions of different beams, so that the MEMS apparatus array can be applied to modules such as an optical cross-connect OXC module and a wavelength selective switching WSS module in the optical communications field, or can be applied to devices such as a micro projector and a laser TV in the consumer field.

Figure 7:
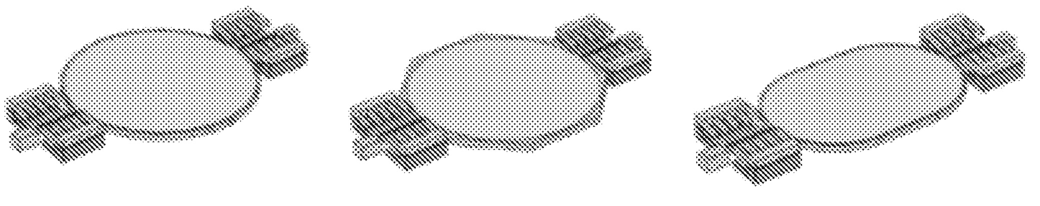
FIG. 7 is a schematic diagram of still other MEMS apparatuses according to an embodiment of the present disclosure.

In addition to a rectangular MEMS apparatus shown in FIG. 5, as shown in FIG. 7, a shape of the movable platform may include but is not limited to a polygon, a circle, or an oval. A drive method of the MEMS apparatus is the same as that described above. In this way, an application scope of the MEMS apparatus is also expanded.

Figure 8:
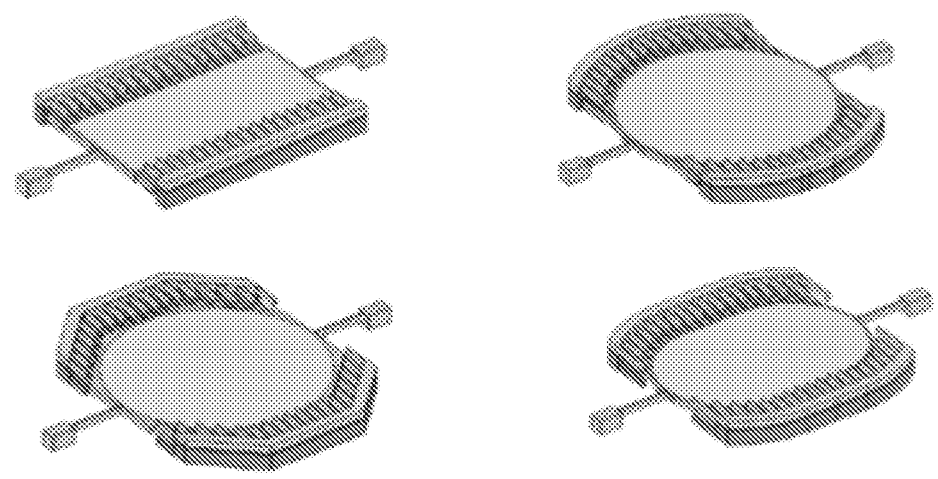
FIG. 8 is a schematic diagram of still other MEMS apparatuses according to an embodiment of the present disclosure.

As shown in FIG. 8, alternatively, three-layer comb finger structures of the MEMS apparatus may be located on two sides of a movable platform, and distributed in an axial direction parallel to a support beam. An advantage is that electrostatic torque for driving comb fingers is greater, so that the movable platform can be driven to rotate at a larger angle.

Figure 9:
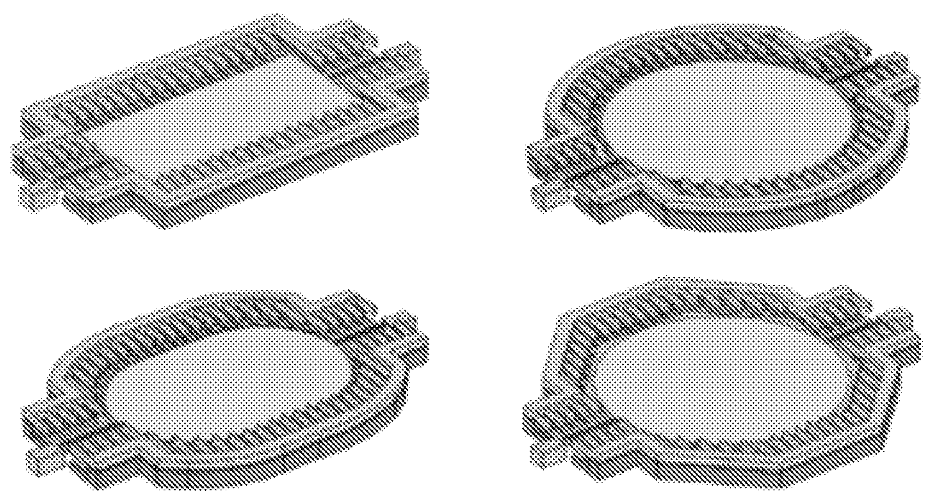
FIG. 9 is a schematic diagram of still other MEMS apparatuses according to an embodiment of the present disclosure.

Further, three-layer comb finger structures may be distributed on two sides of each of a support beam and a movable platform, as shown in FIG. 9. An advantage is that comb fingers are more and an electrostatic drive force or electrostatic drive torque is stronger, so that a rotation angle or displacement of the movable platform is larger. A drive method of the movable platform is the same as that described above.

Figure 10:
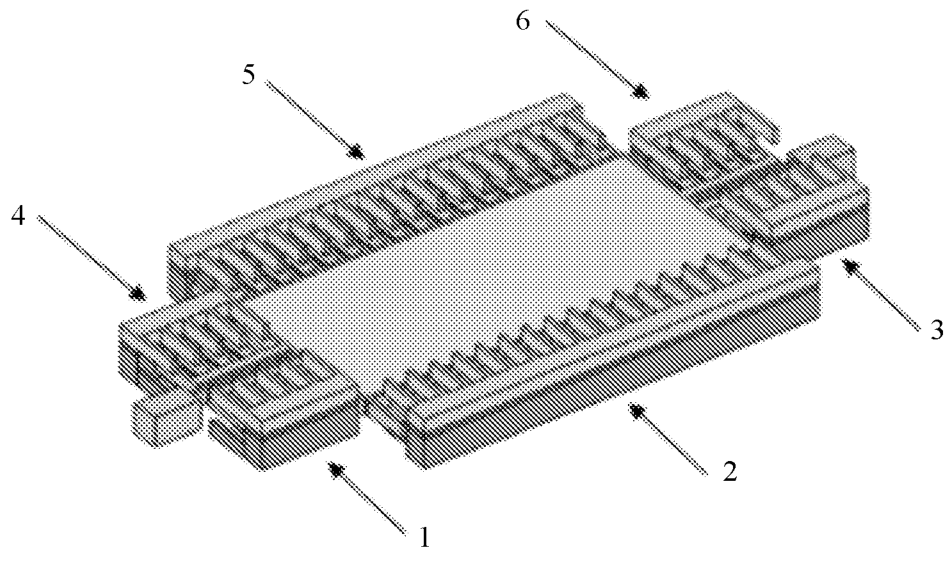
FIG. 10 is a schematic diagram of an MEMS apparatus having a plurality of three-layer comb finger structure on a same side according to an embodiment of the present disclosure.

Alternatively, the MEMS apparatus may have at least two three-layer comb finger structures on a same side. FIG. 10 shows another MEMS apparatus according to an embodiment of the present disclosure. Two sides of a support beam each have three three-layer comb finger structures. A right side of the support beam includes three-layer comb finger structures 1, 2, and 3. A left side of the support beam includes three-layer comb finger structures 4, 5, and 6. The six comb finger structures are controlled independently of each other. Each three-layer comb finger structure may independently drive a movable platform to rotate, or may be flexibly combined to drive the movable platform to rotate.

Likewise, one group of fixed comb fingers and movable comb fingers of each three-layer comb finger structure may be used as a feedback structure, and a rotation angle of the movable platform is fed back by using a capacitance of the feedback structure. Specific drive and feedback methods are the same as those described above. Further, a three-layer comb finger structure with a relatively large quantity of comb fingers is used as a drive comb finger structure, and a three-layer comb finger structure with a relatively small quantity of comb fingers is used as a feedback comb finger structure. In this way, measurement accuracy is higher. Specifically, as shown in FIG. 10, a quantity of comb fingers in each of the second and the fifth three-layer comb finger structures is greater than those in the other four three-layer comb finger structures. In this way, the second and the fifth three-layer comb finger structures each may be used as a drive structure separately or together with another three-layer comb finger structure, and the other three-layer comb finger structures that are not used as drive structures may be used as feedback structures.

Likewise, for this MEMS apparatus including a plurality of comb finger structures on a same side, a shape of a movable platform may include but is not limited to a polygon, a circle, or an oval. A plurality of three-layer comb finger structures on a same side of a support beam are independent of each other, thereby improving application flexibility, and improving control accuracy of the MEMS apparatus.

Figure 11:
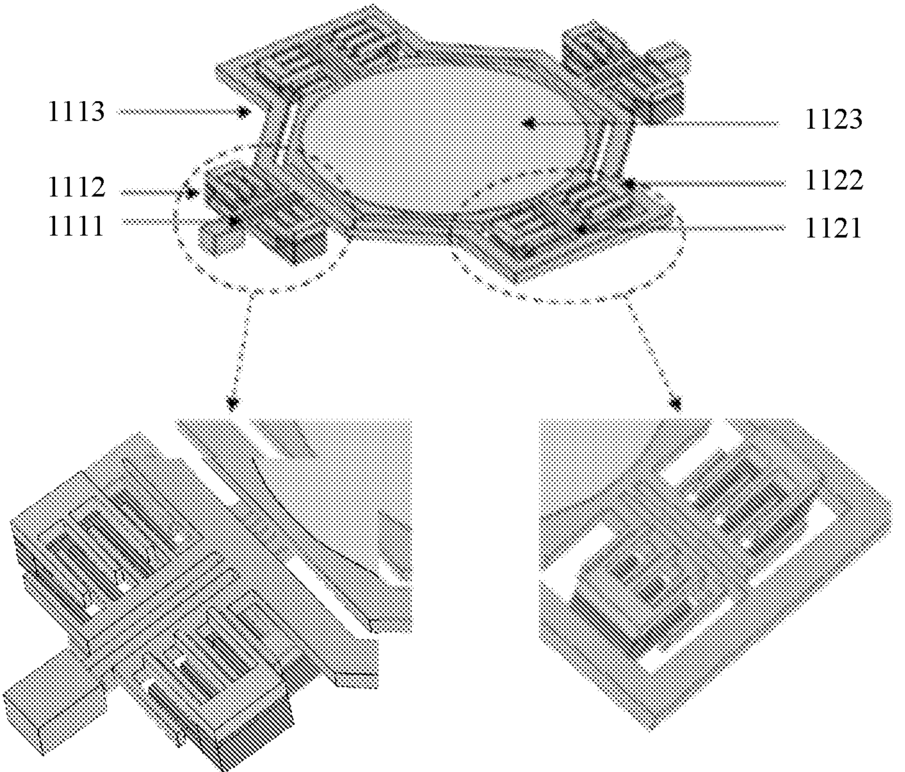
FIG. 11 is a schematic diagram of a two-dimensional MEMS apparatus according to an embodiment of the present disclosure.

As shown in FIG. 11, an embodiment of the present disclosure further provides a two-dimensional MEMS apparatus, to implement two-dimensional rotation of a movable platform. This two-dimensional MEMS apparatus is equivalent to including two MEMS apparatuses, referred to as a first MEMS apparatus and a second MEMS apparatus. The first MEMS apparatus includes a first support beam 1111, first three-layer comb finger structures 1112, and a movable frame 1113. The second MEMS apparatus includes a second support beam 1121, second three-layer comb finger structures 1122, and a movable platform 1123. The active frame 1113 is used as a movable platform of the first MEMS apparatus, and is also used as a substrate for fastening the second MEMS apparatus.

The movable frame 1113 is coupled to the first support beam 1111, and two sides of the first support beam are fastened to a substrate of the entire two-dimensional MEMS apparatus by using anchors (the substrate is not shown in the figure). The three-layer comb finger structures 1112 of the first MEMS apparatus are located on two sides of the first support beam. The movable platform 1123 in the figure, namely, a circular mirror, is a movable platform of the second MEMS apparatus and is also a movable platform of the entire two-dimensional MEMS apparatus; and is fastened to the active frame 1113 by using the second support beam 1121, where fastening points are equivalent to anchors. Upper-layer and lower-layer fixed comb fingers of the three-layer comb finger structures 1122 of the second MEMS apparatus are also fastened to the movable frame 1113, and the second three-layer comb finger structures 1122 are located on two sides of the second support beam 1121. The first support beam and the second support beam are perpendicular to each other. FIG. 11 further includes partial enlarged diagrams of the two MEMS apparatuses.

The three-layer comb finger structures of the first MEMS apparatus and the three-layer comb finger structures of the second MEMS apparatus are controlled, so that the movable platform can rotate around not only the first support beam but also the second support beam, thereby implementing two-dimensional rotation of the movable platform. A method for controlling the comb finger structure is the same as that described above. Likewise, a shape of the movable platform of the two-dimensional MEMS apparatus may include but is not limited to a rectangle, a polygon, a circle, an oval, or the like. The two-dimensional rotation of the movable platform greatly expands an application scope of the MEMS apparatus.

A plurality of two-dimensional MEMS apparatuses may alternatively form a one-dimensional or two-dimensional MEMS apparatus array. The MEMS apparatus array can accurately control reflection directions of different beams, so that the MEMS apparatus array can be applied to modules such as an optical cross-connect OXC module and a wavelength selective switching WSS module in the optical communications field, or can be applied to devices such as a micro projector and a laser TV in the consumer field.

An embodiment of the present disclosure further provides a preparation method of an MEMS apparatus. The MEMS apparatus is prepared through one-time wafer bonding by using one single-layer wafer and one double-layer wafer. The preparation method specifically includes: forming lower-layer fixed comb fingers on a wafer through photoetching; forming movable comb fingers, a movable platform, and a support beam on another double-layer wafer through photoetching; bonding the two wafers; then forming upper-layer fixed comb fingers through photoetching; and releasing the movable platform and the movable comb fingers.

Figure 12:
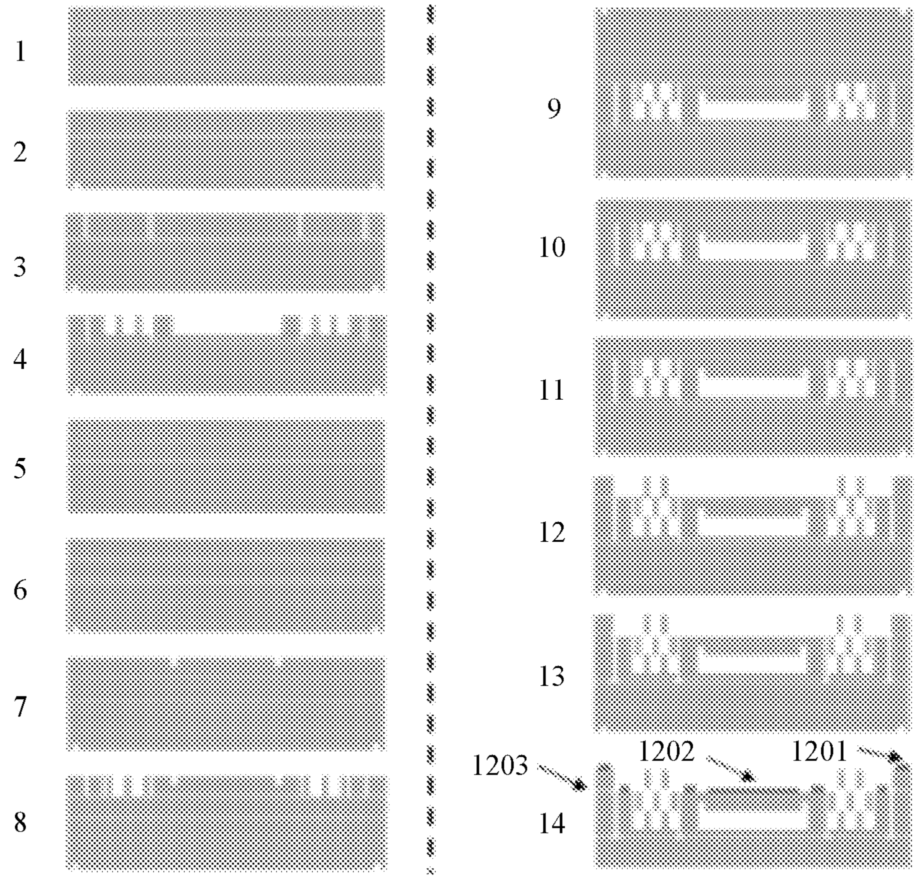
FIG. 12 is a schematic diagram of a preparation method of an MEMS apparatus according to an embodiment of the present disclosure.

A more specific embodiment for preparing an MEMS apparatus is shown in FIG. 12, and includes the following 14 steps: 1. Select a heavily-doped silicon-on-insulator (SOI) first wafer as a substrate for preparing lower-layer fixed comb fingers. 2. Make double-sided photoetching alignment marks at a substrate layer of the first wafer. 3. Form electrical isolation grooves of the lower-layer fixed comb fingers on a device layer of the first wafer through etching. 4. Form the lower-layer fixed comb fingers and a movable platform back cavity structure through photoetching. 5. Select another double-layer heavily-doped SOI second wafer as a substrate for making a movable platform, movable comb fingers, and a lead. 6. Make double-sided photoetching alignment marks at a substrate layer of the second wafer. 7. Form a support beam region through photoetching. 8. Form the movable comb fingers and electrical isolation grooves of the lower-layer fixed comb fingers through photoetching. 9. Form one wafer through Si—Si bonding by using the two SOI wafers. 10. Remove an uppermost Si layer of the wafer through etching. 11. Remove an uppermost SiO2 layer of the wafer through etching. 12. Form upper-layer fixed comb fingers through photoetching. 13. Etch an SiO2 layer through vapor-phase HF etching, to release the movable platform and the movable comb fingers, where a remaining silicon dioxide (SiO2) layer in the double-layer second wafer forms an insulation layer 1203 between the comb fingers, first fixed comb fingers and second fixed comb fingers in a three-layer comb finger structure are electrically isolated from each other by using the insulation layer 1203, and a support beam and a substrate are also electrically isolated from each other by using the insulation layer, so that one insulation layer implements two types of electrical isolation. 14. Prepare metal electrodes 1201 and a mirror reflection layer 1202.

An embodiment of the present disclosure further provides another preparation method of an MEMS apparatus. The MEMS apparatus is prepared through two-time wafer bonding by using three single-layer wafers. The preparation method specifically includes: forming lower-layer fixed comb fingers on a first wafer through photoetching; bonding a second wafer to the first wafer; forming movable comb fingers, a movable platform, and a support beam on a bonded wafer through photoetching; bonding a third wafer to the bonded wafer; forming upper-layer fixed comb fingers on a bonded wafer through photoetching; and releasing the movable platform and the movable comb fingers. A two-time bonding process is more complicated.

Figure 13:
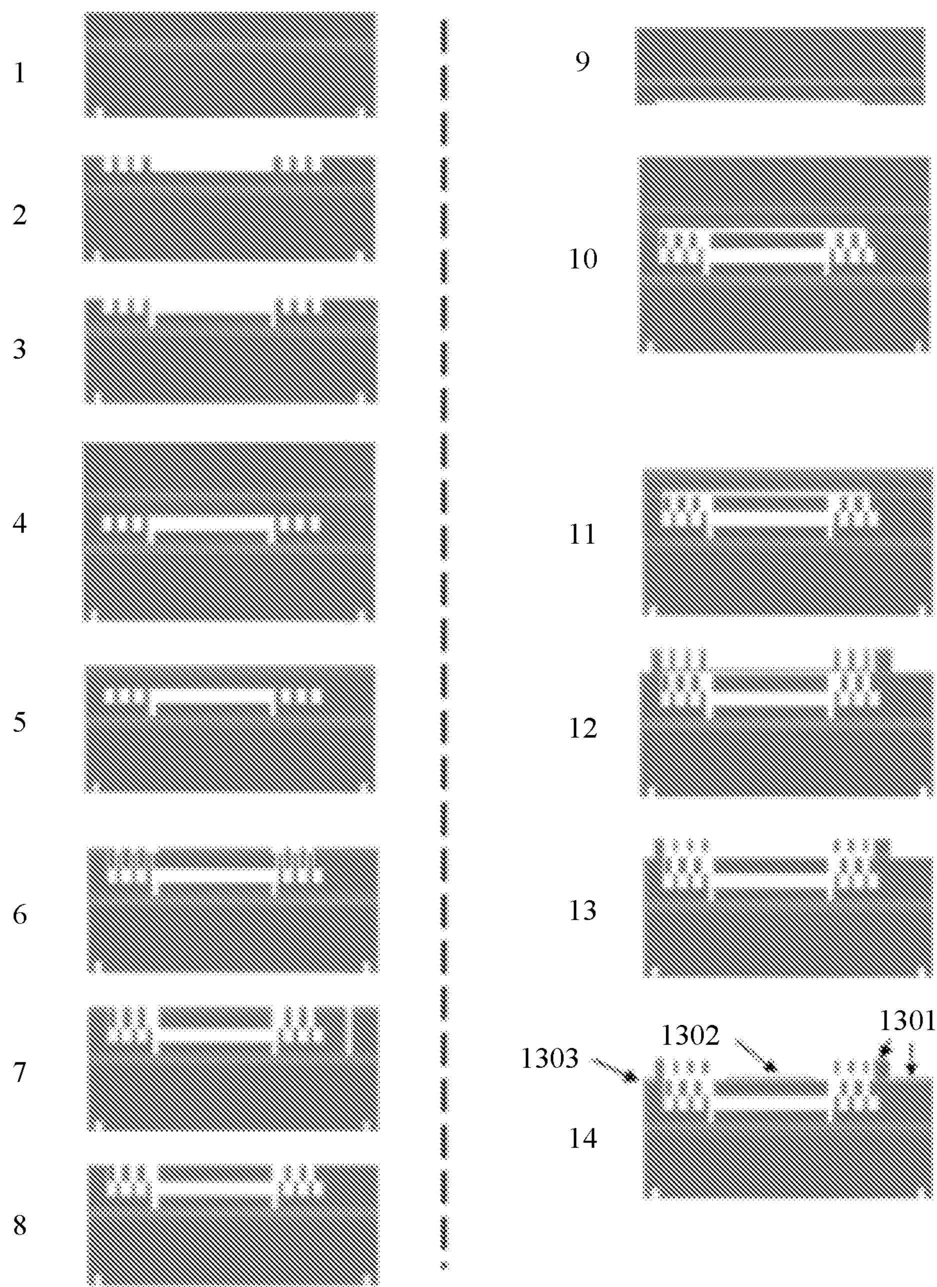
FIG. 13 is a schematic diagram of another preparation method of an MEMS apparatus according to an embodiment of the present disclosure.

A more specific embodiment for preparing an MEMS apparatus is shown in FIG. 13, and includes the following 14 steps: 1. Make double-sided photoetching alignment marks at a substrate layer of a doped SOI first wafer. 2. Form lower-layer fixed comb fingers and a movable platform back cavity through photoetching. 3. Form electrical isolation grooves of the lower-layer fixed comb fingers through etching. 4. Form one wafer through Si—Si bonding by using the first wafer and a doped SOI second wafer. 5. Remove an uppermost Si layer of the wafer through etching. 6. Form movable comb fingers through photoetching. 7. Reduce heights of the lower-layer fixed comb fingers through etching. 8. Remove a hard mask on a surface of a device layer through etching. 9. Prepare a cap (cap) wafer for second-time wafer bonding by using a third wafer. 10. Perform Si—SiO2 bonding on the third wafer and the foregoing bonded wafer to complete the second-time wafer bonding. 11. Remove an uppermost Si layer of a wafer through etching. 12. Form upper-layer fixed comb fingers through etching. 13. Remove SiO2 on the upper-layer fixed comb fingers through vapor-phase HF etching, to release the movable platform and the movable comb fingers, where a remaining SiO2 layer in the second wafer forms an insulation layer 1303 between the comb fingers, first fixed comb fingers and second fixed comb fingers in a three-layer comb finger structure are electrically isolated from each other by using the insulation layer 1303, and a support beam and a substrate are also electrically isolated from each other by using the insulation layer, so that one insulation layer implements two types of electrical isolation. 14. Prepare metal electrodes 1301 and a mirror reflection layer 1302.

Although the present disclosure is described with reference to the embodiments, in a process of implementing the present disclosure that claims protection, a person skilled in the art may understand and implement another variation of the disclosed embodiments by viewing the accompanying drawings, disclosed content, and the appended claims. In the claims, “including” (including) does not exclude another component or another step, and “a” or “one” does not exclude a meaning of plurality. Some measures are recorded in dependent claims that are different from each other, but this does not mean that these measures cannot be combined to produce a better effect.

Although the present disclosure is described with reference to specific features and embodiments thereof, it is obvious that various modifications and combinations may be made thereto. Correspondingly, the specification and the accompanying drawings are merely example description of the present disclosure defined by the appended claims, and are considered as any of or all modifications, variations, combinations or equivalents that cover the scope of the present disclosure. It is clear that a person skilled in the art can make various modifications and variations to the present disclosure without departing from the scope of the present disclosure. The present disclosure is intended to cover these modifications and variations provided that they fall within the scope of protection defined by the following claims and their equivalent technologies.

What is claimed is:

1. A micro-electro-mechanical systems (MEMS) apparatus, comprising:

first fixed comb fingers;

second fixed comb fingers;

a support beam;

a movable platform; and movable comb fingers, wherein the first fixed comb fingers and the second fixed comb fingers are fastened to a substrate, wherein two ends of the support beam are fastened to the substrate, and the movable platform is coupled to the support beam, wherein the movable comb fingers are coupled to the movable platform, and form a three-layer comb finger structure with the first fixed comb fingers and the second fixed comb fingers, wherein the first fixed comb fingers are arranged in a first layer, the second fixed comb fingers are arranged in a second layer, and the movable comb fingers are arranged in third layer between the first and second layers, and wherein the first fixed comb fingers are electrically isolated from the second fixed comb fingers via a first insulation layer, the support beam is electrically isolated from the substrate via a second insulation layer, and the first insulation layer and second insulation layer are located on a same plane.

2. The MEMS apparatus according to claim 1, further comprising:

two three-layer comb finger structures, respectively located on a left side and a right side of the support beam.

3. The MEMS apparatus according to claim 1, wherein the first fixed comb fingers are configured to apply a first electric potential difference between the first fixed comb fingers and the movable comb fingers, and the second fixed comb fingers are configured to apply a second electric potential difference between the second fixed comb fingers and the movable comb fingers.

4. The MEMS apparatus according to claim 1, wherein a metal reflection layer or a dielectric reflection layer is plated on the movable platform.

5. The MEMS apparatus according to claim 1, wherein a shape of the movable platform is a rectangle, a polygon, a circle, or an oval.

6. The MEMS apparatus according to claim 1, wherein the first fixed comb fingers are configured to apply an electric potential difference between the first fixed comb fingers and the movable comb fingers, and the second fixed comb fingers are configured to measure a rotation angle of the movable platform by using a capacitance between the second fixed comb fingers and the movable comb fingers.

7. The MEMS apparatus according to claim 1, wherein the movable comb fingers are coupled to a side that is of the movable platform and that is perpendicular to the support beam.

8. The MEMS apparatus according to claim 1, further comprising:

two three-layer comb finger structures, located on a same side of the support beam, wherein the two three-layer comb finger structures are separately configured to control the movable platform.

9. The MEMS apparatus according to claim 8, wherein one of the two three-layer comb finger structures is configured to apply an electric potential difference to drive the movable platform, and the other three-layer comb finger structure is configured to measure a rotation angle of the movable platform.

10. The MEMS apparatus according to claim 1, further comprising:

the substrate;

a tube housing;

a light window; and a control circuit, wherein the substrate is configured to fasten the first fixed comb fingers and the second fixed comb fingers, and fasten the two ends of the support beam, wherein the tube housing is installed on the substrate, and is configured to protect the MEMS apparatus, wherein the light window is installed on the top of the tube housing, and is configured for light incidence and emergence, and wherein the control circuit is configured to control rotation of the movable platform.

11. A two-dimensional micro-electro-mechanical systems (MEMS) apparatus, comprising:

a first MEMS apparatus; and a second MEMS apparatus, wherein a movable platform of the first MEMS apparatus is used as a substrate for fastening the second MEMS apparatus, wherein a support beam of the first MEMS apparatus and a support beam of the second MEMS apparatus are perpendicular to each other, wherein each of the first MEMS apparatus and the second MEMS apparatus comprises first fixed comb fingers, second fixed comb fingers, a support beam, a movable platform, and movable comb fingers, wherein the first fixed comb fingers and the second fixed comb fingers are fastened to a substrate, wherein two ends of the support beam are fastened to the substrate, and the movable platform is coupled to the support beam, wherein the movable comb fingers are coupled to the movable platform, and form a three-layer comb finger structure with the first fixed comb fingers and the second fixed comb fingers, wherein the first fixed comb fingers are arranged in a first layer, the second fixed comb fingers are arranged in a second layer, and the movable comb fingers are arranged in third layer between the first and second layers, and wherein the first fixed comb fingers are electrically isolated from the second fixed comb fingers via a first insulation layer, the support beam is electrically isolated from the substrate via a second insulation layer, and the first insulation layer and second insulation layer are located on a same plane.

12. The two-dimensional MEMS apparatus according to claim 11, wherein each of the first MEMS apparatus and the second MEMS apparatus comprises two three-layer comb finger structures, respectively located on a left side and a right side of the support beam.

13. The two-dimensional MEMS apparatus according to claim 11, wherein the first fixed comb fingers are configured to apply a first electric potential difference between the first fixed comb fingers and the movable comb fingers, and the second fixed comb fingers are configured to apply a second electric potential difference between the second fixed comb fingers and the movable comb fingers.

14. The two-dimensional MEMS apparatus according to claim 11, wherein a metal reflection layer or a dielectric reflection layer is plated on the movable platform.

15. The two-dimensional MEMS apparatus according to claim 11, wherein the first fixed comb fingers are configured to apply an electric potential difference between the first fixed comb fingers and the movable comb fingers, and the second fixed comb fingers are configured to measure a rotation angle of the movable platform by using a capacitance between the second fixed comb fingers and the movable comb fingers.

16. A micro-electro-mechanical systems (MEMS) apparatus array, comprising:

a plurality of MEMS apparatuses, wherein the plurality of MEMS apparatuses are one-dimensionally distributed or two-dimensionally distributed, wherein each of the plurality of MEMS apparatuses comprises first fixed comb fingers, second fixed comb fingers, a support beam, a movable platform, and movable comb fingers, wherein the first fixed comb fingers and the second fixed comb fingers are fastened to a substrate, wherein two ends of the support beam are fastened to the substrate, and the movable platform is coupled to the support beam, wherein the movable comb fingers are coupled to the movable platform, and form a three-layer comb finger structure with the first fixed comb fingers and the second fixed comb fingers, wherein the first fixed comb fingers are arranged in a first layer, the second fixed comb fingers are arranged in a second layer, and the movable comb fingers are arranged in third layer between the first and second layers, and wherein the first fixed comb fingers are electrically isolated from the second fixed comb fingers via a first insulation layer, the support beam is electrically isolated from the substrate via a second insulation layer, and the first insulation layer and second insulation layer are located on a same plane.

17. A method for preparing a micro-electro-mechanical systems (MEMS) apparatus, comprising:

forming first fixed comb fingers on a first wafer through photoetching;

forming movable comb fingers, a movable platform, and a support beam on a double-layer second wafer through photoetching;

bonding the first wafer to the double-layer second wafer to form a bonded wafer, after the double-layer second wafer has been photoetched with the movable comb fingers, the movable platform, and the support beam;

forming second fixed comb fingers on the bonded wafer through photoetching; and releasing the movable platform and the movable comb fingers.

* * * * *